(12) United States Patent
Chang et al.

(10) Patent No.: US 10,388,700 B2
(45) Date of Patent: Aug. 20, 2019

(54) ELECTRONIC DEVICE PACKAGE

(71) Applicant: E Ink Holdings Inc., Hsinchu (TW)

(72) Inventors: Kuo-Yen Chang, Hsinchu (TW); Chia-Chun Yeh, Hsinchu (TW); Kuo-Hsing Cheng, Hsinchu (TW); Hsing-Yi Wu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/603,440

(22) Filed: May 23, 2017

(65) Prior Publication Data

US 2018/0026078 A1 Jan. 25, 2018

(30) Foreign Application Priority Data

Jul. 22, 2016 (CN) .......................... 2016 1 0579308

(51) Int. Cl.
*H01L 23/00* (2006.01)
*H01L 23/28* (2006.01)
(Continued)

(52) U.S. Cl.
CPC ............ *H01L 27/283* (2013.01); *H01L 23/28* (2013.01); *H01L 23/3185* (2013.01);
(Continued)

(58) Field of Classification Search
CPC . H01L 51/0541; H01L 27/283; H01L 51/107; H01L 27/3258; H01L 23/28;
(Continued)

(56) References Cited

U.S. PATENT DOCUMENTS

| 6,956,324 B2 * | 10/2005 | Yamazaki | ............... H01L 51/52 313/498 |
| 7,274,142 B2 * | 9/2007 | Mori | ...................... H01L 51/56 313/504 |

(Continued)

FOREIGN PATENT DOCUMENTS

| CN | 1812119 | 8/2006 |
| TW | 200507032 | 2/2005 |

(Continued)

OTHER PUBLICATIONS

"Office Action of Taiwan Counterpart Application," dated Jun. 27, 2017, p. 1-p. 10, in which the listed references were cited.

*Primary Examiner* — Allen L Parker
*Assistant Examiner* — Charles N Ausar-El
(74) *Attorney, Agent, or Firm* — JCIPRNET (57) ABSTRACT

An electronic device package includes a carrying board, an electronic device, a first insulating layer, and a barrier layer. The carrying board includes a central area, an inner edge area, and an outer edge area. The inner edge area is located between the central area and the outer edge area. The electronic device is located in the central area. The first insulating layer is located on the carrying board and overlapped with the electronic device and extends from the central area to the inner edge area. The barrier layer is located on the carrying board. Here, the barrier layer includes a sidewall contact portion and an extending portion. The sidewall contact portion surrounds a side surface of the first insulating layer, and the extending portion extends from the sidewall contact portion to the outer edge area in a direction away from the first insulating layer.

20 Claims, 5 Drawing Sheets

(51) Int. Cl.
  *H01L 23/31* (2006.01)
  *H01L 23/532* (2006.01)
  *H01L 23/552* (2006.01)
  *H01L 27/28* (2006.01)
  *H01L 27/32* (2006.01)
  *H01L 51/05* (2006.01)
  *H01L 51/10* (2006.01)

(52) U.S. Cl.
  CPC ........ *H01L 23/5329* (2013.01); *H01L 23/552* (2013.01); *H01L 23/564* (2013.01); *H01L 27/3258* (2013.01); *H01L 51/0541* (2013.01); *H01L 51/107* (2013.01)

(58) Field of Classification Search
  CPC . H01L 23/564; H01L 23/3185; H01L 23/552; H01L 23/5329
  See application file for complete search history.

(56) References Cited

U.S. PATENT DOCUMENTS

| | | | |
|---|---|---|---|
| 7,667,338 B2* | 2/2010 | Lin | B29C 45/14655 257/686 |
| 8,885,244 B2 | 11/2014 | Gally et al. | |
| 8,975,620 B2* | 3/2015 | Lan | H01L 51/0512 257/40 |
| 9,343,698 B2* | 5/2016 | Negishi | H01L 51/5253 |
| 9,761,653 B2* | 9/2017 | Benwadih | H01L 27/3258 |
| 2004/0004434 A1* | 1/2004 | Nishi | H01L 27/322 313/506 |
| 2005/0156173 A1 | 7/2005 | Yamazaki et al. | |
| 2006/0125390 A1* | 6/2006 | Oh | H01L 27/3276 313/506 |
| 2009/0137178 A1* | 5/2009 | Sakakura | H01L 51/5237 445/25 |
| 2009/0252894 A1* | 10/2009 | McCormick | H01L 51/5237 427/579 |
| 2010/0215929 A1* | 8/2010 | Seo | H01L 51/5237 428/213 |
| 2010/0327737 A1 | 12/2010 | Hayashi et al. | |
| 2011/0012198 A1* | 1/2011 | Yagi | H01L 27/3246 257/346 |
| 2011/0057208 A1* | 3/2011 | Jeon | H01L 51/5246 257/88 |
| 2011/0193067 A1* | 8/2011 | Lee | H01L 51/5256 257/40 |
| 2011/0285955 A1 | 11/2011 | Nagasawa | |
| 2012/0032178 A1* | 2/2012 | Imai | H01L 27/3258 257/59 |
| 2013/0256819 A1* | 10/2013 | Watanabe | H01L 43/02 257/422 |
| 2014/0339516 A1* | 11/2014 | Hu | H01L 51/448 257/40 |
| 2015/0207100 A1* | 7/2015 | Saito | H01L 51/5246 257/40 |
| 2015/0236286 A1 | 8/2015 | Kao et al. | |
| 2017/0110526 A1* | 4/2017 | Eo | H01L 27/3258 |

FOREIGN PATENT DOCUMENTS

| | | |
|---|---|---|
| TW | 200917490 | 4/2009 |
| TW | 201405804 | 2/2014 |
| TW | 201407846 | 2/2014 |

* cited by examiner

ELECTRONIC DEVICE PACKAGE

CROSS-REFERENCE TO RELATED APPLICATION

This application claims the priority benefit of China application serial no. 201610579308.5, filed on Jul. 22, 2016. The entirety of the above-mentioned patent application is hereby incorporated by reference herein and made a part of this specification.

FIELD OF THE INVENTION

The invention relates to a package; more particularly, the invention relates to an electronic device package.

DESCRIPTION OF RELATED ART

Owing to the growing requirements for precise design of electronic devices in electronic products, the electronic devices are highly sensitive to moisture. For instance, permeation of moisture in an organic thin film transistor (OTFT) array easily degrade the OTFTs, and thus the degraded OTFTs cannot function in a normal manner. In general, the OTFT array is constituted by a plurality of film layers stacked sequentially. Parts of the film layers may successively extend from the central portion to the edge portion of the OTFT array. Since moisture and oxygen may permeate into the film layers extending to the edge portion through the sides of the film layers and thus accelerate the degradation of the OTFTs, the service life of the electronic products may be reduced, and accordingly consumers' requirements cannot be satisfied.

SUMMARY OF THE INVENTION

The invention is directed to an electronic device package that can better prevent the electronic device from being damaged by moisture permeating through the sides of the electronic device package.

In an embodiment of the invention, an electronic device package includes a carrying board, an electronic device, a first insulating layer, and a barrier layer. The carrying board includes a central area, an inner side area, and an outer side area. The inner side area is located between the central area and the outer side area. The electronic device is located in the central area of the carrying board. The first insulating layer is located on the carrying board and overlapped with the electronic device, and the first insulating layer extends from the central area to the inner side area. The barrier layer is located on the carrying board. Here, the barrier layer includes a sidewall contact portion and an extending portion. The sidewall contact portion surrounds a side surface of the first insulating layer, and the extending portion extends from the sidewall contact portion to the outer side area in a direction away from the first insulating layer.

According to an embodiment of the invention, the barrier layer further includes a cover portion. The cover portion extends from the sidewall contact portion in a direction away from the extending portion, covers the first insulating layer, and exposes the central portion.

According to an embodiment of the invention, the electronic device includes an OTFT transistor which includes a gate, a source, a drain, and an organic semiconductor channel layer. An area of the gate is overlapped with an area of the organic semiconductor channel layer. The first insulating layer is located between the gate and the organic semiconductor channel layer. The source and the drain are connected to the organic semiconductor channel layer.

According to an embodiment of the invention, the sidewall contact portion covers the side surface of the first insulating layer.

According to an embodiment of the invention, the electronic device package further includes a second insulating layer, and the first insulating layer is located between the second insulating layer and the carrying board.

According to an embodiment of the invention, an area of the second insulating layer exceeds the side surface of the first insulating layer and has a sidewall portion, and the sidewall portion is located between the side surface of the first insulating layer and the sidewall contact portion.

According to an embodiment of the invention, the electronic device package further includes a sidewall block structure located in the inner side area, and the sidewall block structure penetrates the first insulating layer and constitutes a wall-like structure.

According to an embodiment of the invention, the sidewall block structure includes a plurality of sub-block structures stacked together in a direction perpendicular to the carrying board. A material of each of the sub-block structures includes metal.

According to an embodiment of the invention, the extending portion of the barrier layer has a concave-convex surface at an upper side away from the carrying board. The concave-convex surface has a sawtooth shape, a micro-cup shape, a ladder shape, or a combination of any of the above shapes.

According to an embodiment of the invention, a material of the barrier layer is SiNx, SiOx, or multiple layers of SiNx/SiOx thin films.

According to an embodiment of the invention, the electronic device package further includes an organic buffer layer, a bottom barrier layer, a display medium layer, and a protection layer. The organic buffer layer is located between the electronic device and the carrying board. The bottom barrier layer is located between the organic buffer layer and the carrying board. The display medium layer is located on the electronic device, and the display medium layer and the electronic device are electrically connected to each other and configured to display images. The protection layer is located on the display medium layer.

According to an embodiment of the invention, the extending portion of the barrier layer is in contact with the bottom barrier layer.

According to an embodiment of the invention, the sidewall contact portion of the barrier layer covers a side surface of the organic buffer layer.

In another embodiment of the invention, an electronic device package includes a carrying board, an electronic device, a plurality of insulating layers, and a sidewall block structure. The carrying board includes a central area and an edge area. The electronic device is located in the central area of the carrying board. The insulating layers are located on the carrying board and overlapped with the electronic device, and the insulating layers respectively extend from the central area to the edge area. The sidewall block structure is located in the edge area, and the sidewall block structure penetrates the insulating layers and constitutes a stopper wall.

According to an embodiment of the invention, the sidewall block structure includes a plurality of sub-block structures stacked together in a direction perpendicular to the carrying board.

According to an embodiment of the invention, one of the sub-block structures is electrically connected to the electronic device. A material of each of the sub-block structures includes metal.

According to an embodiment of the invention, the sidewall block structure is electrically floating.

According to an embodiment of the invention, the electronic device includes an OTFT. The insulating layers include a first insulating layer and a second insulating layer. The OTFT includes a gate, a source, a drain, and an organic semiconductor channel layer. An area of the gate is overlapped with an area of the organic semiconductor channel layer. The first insulating layer is located between the gate and the organic semiconductor channel layer. The source and the drain are connected to the organic semiconductor channel layer, and the first insulating layer is located between the second insulating layer and the carrying board.

According to an embodiment of the invention, the electronic device package further includes an organic buffer layer, a bottom barrier layer, a display medium layer, and a protection layer. The organic buffer layer is located between the electronic device and the carrying board. The bottom barrier layer is located between the organic buffer layer and the carrying board. The display medium layer is located on the electronic device, and the display medium layer and the electronic device are electrically connected to each other and configured to display images. The protection layer is located on the display medium layer.

In view of the above, the block structure has a specific height in a direction perpendicular to a plane where the carrying board is located, so as to form a stopper wall or a similar structure around the electronic device package. Thereby, the electronic device in the electronic device package can be better protected from moisture permeating through the sides of the electronic device package.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
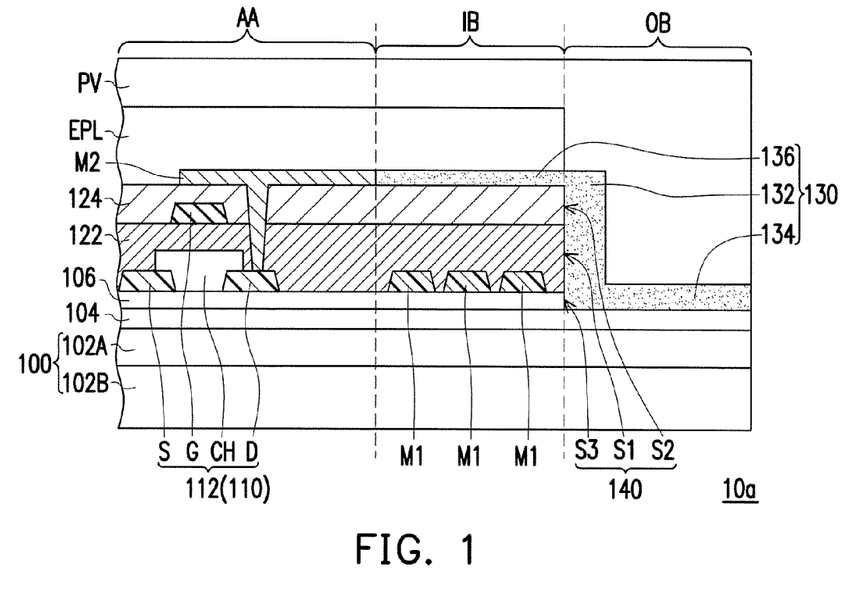
FIG. 1 is a schematic cross-sectional view of an electronic device package according to a first embodiment of the invention.

FIG. 1 is a schematic cross-sectional view of an electronic device package according to a first embodiment of the invention. With reference to FIG. 1, an electronic device package 10*a* includes a carrying board 100, an electronic device 110, a first insulating layer 122, and a barrier layer 130. The carrying board 100 includes a central area AA and an edge area around the central area AA. The edge area can be divided into an inner side area IB and an outer side area OB. The inner side area IB is located between the central area AA and the outer side area OB. In the present embodiment, the carrying board 100 may be a rigid substrate, e.g., a glass substrate or any other substrate with favorable mechanical strength; however, the invention is not limited thereto. The carrying board 100 is configured to properly support the electronic device package 10*a*.

The electronic device 110 is located on the carrying board 100 and in the central area AA of the carrying board 100. The first insulating layer 122 is located on the carrying board 100 and overlapped with the electronic device 110, and the first insulating layer 122 extends from the central area AA to the inner side area IB of the carrying board 100. The barrier layer 130 is located on the carrying board 100. Here, the barrier layer 130 includes a sidewall contact portion 132 and an extending portion 134. The sidewall contact portion 132 surrounds a side surface S1 of the first insulating layer 122, and the extending portion 134 extends from the sidewall contact portion 132 to the outer side area OB in a direction away from the first insulating layer 122.

Besides, according to actual requirements, the electronic device package 10*a* may further include one or more traces M1 on the carrying board 100. Specifically, the traces M1 may be arranged in the inner side area IB and electrically connected to the electronic device 100, such that the traces M1 may act as the electrical transmission path between the electronic device 110 and a driving circuit. However, the invention is not limited thereto. When the traces M1 are electrically connected to the electronic device 110, the traces M1 may serve to transmit signals. By contrast, when the traces M1 are not electrically connected to the electronic device 100, the traces M1 may serve as electrostatic discharge protection circuits or may provide an electrical shielding function. In addition, according to another embodiment of the invention, the traces M1 in the inner side area IB of the electronic device package 10*a* may be optionally omitted, which should not be construed as a limitation to the invention.

For the clarity purpose, the "outer side" provided herein refers to the side of the electronic device package 10*a* which is more proximate to the outer side area OB than to the central area AA of the carrying board 100. For the clarity purpose, the "inner side" provided herein refers to the side of the electronic device package 10*a* which is more proximate to the central area AA than the outer side area OB of the carrying board 100.

With reference to FIG. 1, in order to stably support the electronic device package 10*a* during its fabrication and ensure the flexibility of the resultant electronic device package 10a, the carrying board 100 of the electronic device package 10a may include a flexible substrate 102A and a support substrate 102B in the present embodiment. The flexible substrate 102a is located between the electronic device 110 and the support substrate 102B. For instance, a material of the flexible substrate 102A may be a flexible material, such as polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN), or polyetherimide (PEI), for instance. After the electronic device package 10a is completely formed, the flexible substrate 102A and the support substrate 102B may be separated from each other. Here, the carrying board 100 may be merely composed of the flexible substrate 102A.

To enhance the moisture impermeability of the flexible substrate 102A, the electronic device package 10a in the present embodiment may further include a bottom barrier layer 104 located between the electronic device 110 and the flexible substrate 102A and between the first insulating layer 122 and the flexible substrate 102A. The bottom barrier layer 104 may be a single layer thin film or a stacked layer constituted by plural thin films. The number of layers of thin films and the material of the bottom barrier layer 104 are not limited in the present embodiment. As provided above, if the bottom barrier layer 104 is a stacked layer constituted by plural thin films, the bottom barrier layer 104 is, for instance, a stacked layer formed by alternately stacking organic and inorganic thin films or formed by stacking plural inorganic thin films. If the bottom barrier layer 104 is a stacked layer formed by stacking plural inorganic thin films, the bottom barrier layer 104 may be a stacked layer formed by alternately stacking silicon nitride (SiNx) and silicon oxide (SiOx). The water vapor transmission rate (WVTR) of the bottom barrier layer 104 is not greater than $10^{-2}$ g/m$^2$/day, preferably not greater than $10^{-6}$ g/m$^2$/day.

To release the stress between the electronic device 110 and the bottom barrier layer 104 and enhance the adhesion of the electronic device 110, an organic buffer layer 106 may be selectively arranged between the electronic device 110 and the bottom barrier layer 104, so as to improve the reliability of the electronic device 110. In the present embodiment, the organic buffer layer 106 is located between the electronic device 110 and the carrying board 100 and is between the organic buffer layer 106 and the carrying board 100.

The electronic device 110 may include TFTs. To be specific, the TFTs may include amorphous silicon (a-Si) TFTs, micro-silicon (micro-Si) TFTs, polysilicon (p-Si) TFTs, OTFTs, and so on. In the present embodiment, the electronic device 110 includes an OTFT 112, which should not be construed as a limitation to the invention. In other embodiments of the invention, the electronic device 110 may further include a capacitor structure, diode, or other components. The OTFT 112 is constituted by a plurality of patterned thin films, and the thin films may be formed through performing an ink-jet process, a spin coating process, a flexographic printing process, or a deposition process and may be patterned to the required patterns through performing a photolithographic and etching process. In particular, the OTFT includes a gate G, a source S, a drain D, and an organic semiconductor channel layer CH. An area of the gate G is overlapped with an area of the organic semiconductor channel layer CH. The first insulating layer 122 is located between the gate G and the organic semiconductor channel layer CH. The source S and the drain D are connected to the organic semiconductor channel layer CH.

In terms of operations, the gate G is able to control the OTFT 112 to be turned on or off. When the OTFT 112 is turned on, the OTFT 112 allows the source S to be electrically connected to the drain D through the organic semiconductor channel layer CH.

In the present embodiment, the electronic device package 10a further includes a second insulating layer 124. The first insulating layer 122 is located between the second insulating layer 124 and the carrying board 100. Besides, in the present embodiment, the electronic device package 10a may further include a conductive layer M2 located on the second insulating layer 124, and the conductive layer M2 can be electrically connected to the drain D. Thereby, when the electronic device 110 is turned on, the electronic device 110 can be electrically communicated with other components through the conductive layer M2. In the present embodiment, the electronic device package 10a is constituted by plural film layers stacked on the carrying board 100. First, the bottom barrier layer 104 and the organic buffer layer 106 are sequentially formed on the carrying board 100. At this time, the source S and the drain D acting as the OTFT 112 as well as the traces M1 may be the first conductive layer and simultaneously formed on the organic buffer layer 106. That is, the source S, the drain D, and the traces M1 may be formed in the same manufacturing process. The organic semiconductor channel layer CH, the first insulating layer 122, the gate G, the second insulating layer 124, and the traces M2 can then be formed sequentially. Before the gate G and the traces M2 are formed, the first insulating layer 122 and the second insulating layer 124 may be properly patterned, so as to form an opening on the drain D. Thereby, the traces M2 may be electrically connected to the drain D through the opening.

In other embodiments of the invention, the electronic device package 10a may further include other insulating layers, and the number of the insulating layers is not limited in the invention. For instance, the electronic device package 10a may further include a third insulating layer, a fourth insulating layer, and so forth. Besides, the first insulating layer 122 and the second insulating layer 124 may be made of an organic insulating material, e.g., parylene, HMDSO, or any other organic material with the insulating properties. The WVTR of the organic insulating material may reach $10^{-2}$ g/m$^2$/day approximately. During the manufacturing process, no matter whether the first insulating layer 122 and the second insulating layer 124 are formed through chemical vapor deposition, physical vapor deposition, or heating and curing wet films, defects in the first insulating layer 122 or the second insulating layer 124 are inevitably gathered to form pin holes. As shown in FIG. 1, if the side surface S1 of the first insulating layer 122 and the side surface S2 of the second insulating layer 124 are exposed, moisture may enter the electronic device package 10a through the side surfaces S1 and S2; furthermore, moisture may be rapidly diffused through the pin holes in the first insulating layer 122 or the second insulating layer 124 and may then be in contact with the electronic device 110, thus resulting in damages to the electronic device 110.

In the present embodiment, if a side surface S3 of the organic buffer layer 106 is exposed, moisture may also enter the electronic device package 10a through the side surface S3 and cause damages to the electronic device 110. Hence, the sidewall contact portion 132 of the barrier layer 130 surrounds and covers the side surfaces S1, S2, and S3, and the extending portion 134 of the barrier layer 130 extends from the sidewall contact portion 132 to the outer side area OB in a direction away from the first insulating layer 122 and is in contact with the bottom barrier layer 104. At this time, the sidewall contact portion 132 and the extending portion 134 have an L-shaped structure located in the outer side area OB of the carrying board 100. A material of the barrier layer 130 may be an inorganic material, e.g., SiNx, SiOx, and so on. Besides, the barrier layer 130 may also be constituted by plural SiNx/SiOx thin films that are stacked together. The WVTR of said materials is less than $10^{-4}$ g/m²/day. The less the WVTR of the barrier layer 130 is, the better the moisture is prevented from entering the barrier layer 130 through the outer side of the electronic device package 10a. As a result, the electronic device 110 can be protected from being affected by moisture. It should be mentioned that the material of the barrier layer 130 is not limited to those provided above and may be adjusted and changed according to the required WVTR.

Additionally, in the present embodiment, the sidewall contact portion 132 of the barrier layer 130 covers the side surface S3 of the organic buffer layer 106 and the side surface S1 of the first insulating layer 122, and an interface 140 is formed at a region where the sidewall contact portion 132 is in contact with the side surfaces S1, S2, and S3. The interface 140 is conducive to the prevention of moisture from being diffused to the first insulating layer 122, the second insulating layer 124, and the organic buffer layer 106 located on the inner side and the protection of the electronic device 110 from the moisture. As such, the electronic device 110 can have favorable quality. Specifically, the interface 140 enables the pin holes in the first insulating layer 122, the second insulating layer 124, and the organic buffer layer 106 not to be continuous to the pin holes in the sidewall contact portion 132. As a result, the moisture cannot be rapidly diffused into the inner side from the outer side of the electronic device package 10a through the pin holes and thus does not pose any impact on the electronic device 110, i.e., the electronic device 110 can be protected from moisture.

According to the present embodiment, the barrier layer 130 further includes a cover portion 136. The cover portion 136 extends from the sidewall contact portion 132 in a direction away from the extending portion 134, covers the first insulating layer 122, and exposes the central portion AA. Namely, in the present embodiment, no cover portion 136 of the barrier layer 130 is arranged on the central area AA, the barrier layer 130 does not extend to the central area AA, or the barrier layer 130 does not completely cover the central area AA. The inorganic material is more brittle than the organic material. Hence, the barrier layer 130 is more brittle than the first insulating layer 122 and the second insulating layer 124. For instance, when the electronic device package 10a is taken to perform a ball shear test, the electronic device package 10a is likely to be cracked if the barrier layer 130 is distributed in the central area AA, whereby other devices may be affected, or the electronic device package 10a cannot function as usual. Hence, in the present embodiment, the central area AA of the barrier layer 130 is exposed, so as to better prevent the barrier layer 130 from being cracked and ensure that the electronic device package 10a can well withstand external forces.

In the present embodiment, the electronic device package 10a may further include a display medium layer EPL and a protection layer PV. The display medium layer EPL is encapsulated between the protection layer PV and the carrying board 100. The display medium layer EPL is located on the electronic device 110, and the display medium layer EPL and the electronic device 110 are electrically connected to each other through the conductive layer M2 and configured to display images. The display medium in the display medium layer EPL may be liquid crystal, a display medium composed of dielectric solvent and multiple charged particles doped in the dielectric solvent, or any other appropriate display medium. The type and the material of the display medium layer EPL are not limited in the invention. That is, the electronic device package 10a may be configured to display images and may act as a display; however, in another embodiment, a sensing material (e.g., a photoelectric conversion material capable of converting light energy into electric energy) may replace the display medium layer EPL and may be arranged on the electronic device 110, such that the electronic device package 10a may act as a sensor.

Figure 2:
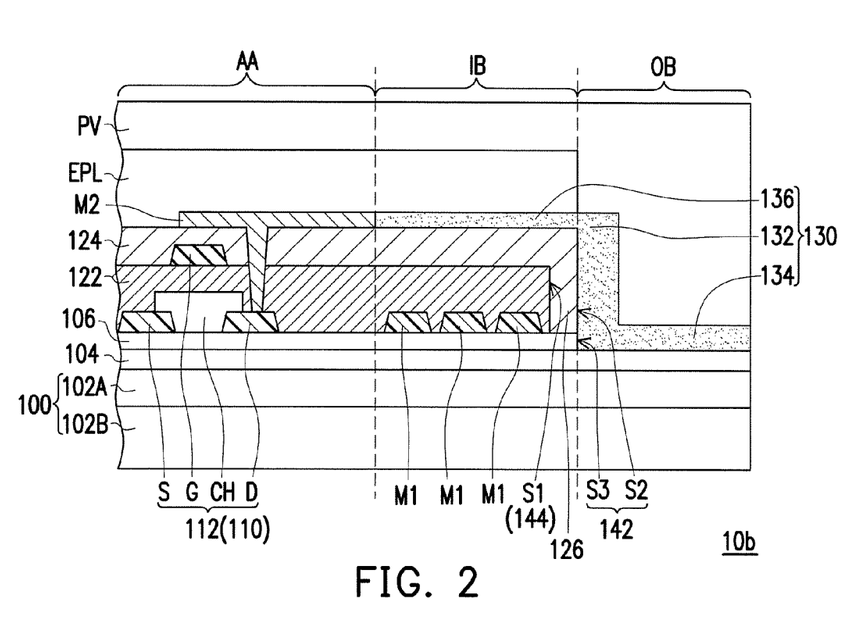
FIG. 2 is a schematic cross-sectional view of an electronic device package according to a second embodiment of the invention.

FIG. 2 is a schematic cross-sectional view of an electronic device package according to a second embodiment of the invention. With reference to FIG. 2, the electronic device package 10b includes the carrying board 100, the bottom barrier layer 104, the organic buffer layer 106, the electronic device 110, the first insulating layer 122, the second insulating layer 124, the barrier layer 130, the display medium layer EPL, the protection layer PV, the conductive layer M2, and the traces M1, as shown in FIG. 1. The electronic device package 10b is similar to that provided in the first embodiment and depicted in FIG. 1, and the characteristics of the components and the connection correlations of the components in the electronic device package 10b may be referred to as those of the components in the electronic device package 10a and thus will not be further explained hereinafter. The difference between the electronic device package 10b provided in the present embodiment and the electronic device package 10a is that the area of the second insulating layer 124 exceeds the first insulating layer 122 and has a sidewall portion 126. The sidewall portion 126 is located between the side surface S1 of the first insulating layer 122 and the sidewall contact portion 132, and the second insulating layer 124 may encapsulate the first insulating layer 122. Besides, the sidewall contact portion 132 surrounds the side surface S1, the side surface S2 of the sidewall portion 126 away from the side surface S1, and the side surface S3 of the organic buffer layer 106 and covers the side surfaces S2 and S3.

In the present embodiment, the number of film layers stacked on the sidewall portion 126 from the inner side to the outer side of the electronic device package 10b can be increased, and an interface is formed between every two of the stacked films. Particularly, the film layers stacked on the sidewall portion 126 from the inner side to the outer side of the electronic device package 10b are the first insulating layer 122, the sidewall portion 126 of the second insulating layer 124, and the sidewall contact portion 132 in sequence. The side surface S2 of the sidewall portion 126, the side surface S3 of the organic buffer layer 106, and the sidewall contact portion 132 can form an interface 142. Besides, another interface 144 is formed between the sidewall portion 126 and the side surface S1 of the first insulating layer 122. As such, similar to the interface 140 depicted in FIG. 1, the interfaces 142 and 144 provided herein are conducive to the prevention of moisture from being rapidly diffused into the inner side from the outer side of the electronic device package 10b, and thus the electronic device 110 may be protected from the moisture, and favorable quality of the electronic device 110 can be guaranteed.

It should be noted that the number of the stacked insulating layers is not limited herein and can be adjusted according to actual requirements. In another embodiment of the invention, the area of the organic buffer layer 106 of the electronic device package 10b may be smaller than the area of the second insulating layer 124, such that the sidewall portion 126 encapsulates the side surface S3 of the organic buffer layer 106. Besides, the electronic device package 10b may further include a third insulating layer (not shown), and the area of the third insulating layer exceeds the second insulating layer 124 and has another sidewall portion. Particularly, the film layers stacked on the sidewall portion 126 from the inner side to the outer side of the electronic device package 10b are the first insulating layer 122, the second insulating layer 124, the third insulating layer, and the sidewall contact portion 132, and three different interfaces are formed. Thereby, the three different interfaces may effectively block moisture from being diffused from the outer side of the electronic device package 10b to the inner side, and the favorable quality of the electronic device 110 can be guaranteed.

Figure 3:
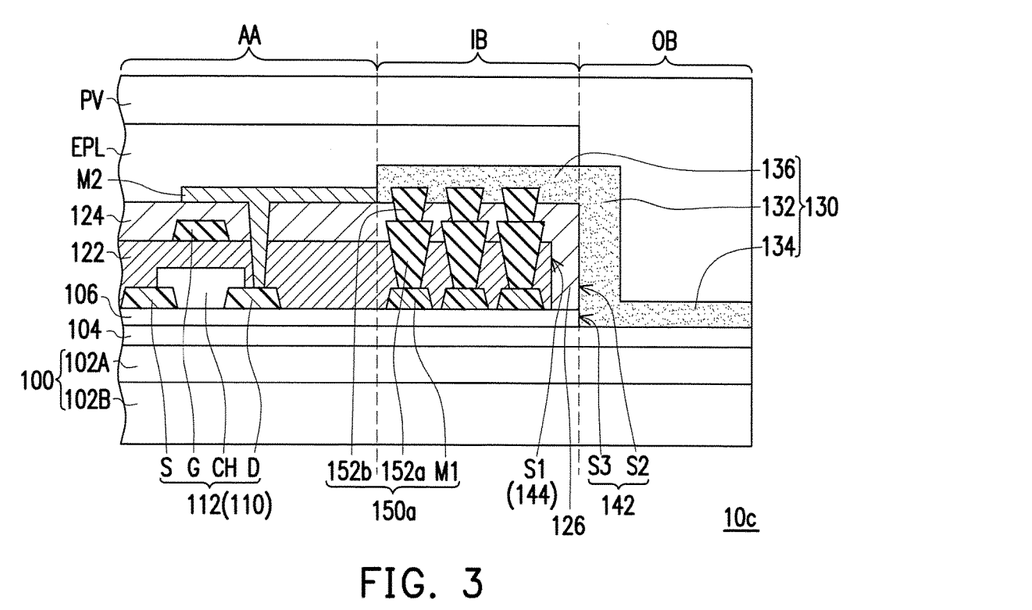
FIG. 3 is a schematic cross-sectional view of an electronic device package according to a third embodiment of the invention.
Figure 4:
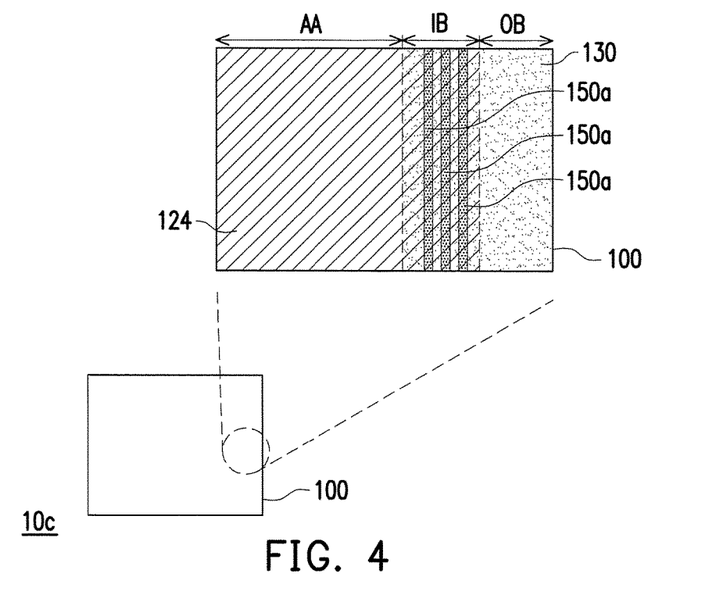
FIG. 4 is a schematic top view of the electronic device package according to the third embodiment of the invention.

FIG. 3 is a schematic cross-sectional view of an electronic device package according to a third embodiment of the invention. FIG. 4 is a schematic top view of the electronic device package 10c according to the third embodiment of the invention. With reference to FIG. 3, the electronic device package 10c includes the carrying board 100, the bottom barrier layer 104, the organic buffer layer 106, the electronic device 110, the first insulating layer 122, the second insulating layer 124, the barrier layer 130, the display medium layer EPL, the protection layer PV, the conductive layer M2, and the traces M1, as shown in FIG. 2. The electronic device package 10c is similar to the electronic device package 10b depicted in FIG. 2, and the characteristics of the components and the connection correlations of the components in the electronic device package 10c may be referred to as those of the components in the electronic device packages 10a and 10b and thus will not be further explained hereinafter.

In the present embodiment, the difference between the electronic device package 10c and the electronic device package 10b lies in that the electronic device package 10c further includes one or more sidewall block structures 150a located in the inner side area IB, and the sidewall block structures 150a penetrate the first insulating layer 122 and the second insulating layer 124 and constitute a wall-like structure. The sidewall block structures 150a are located on the organic buffer layer 106 and covered by the cover portion 136 of the barrier layer 130. Specifically, the sidewall block structures 150a may include a plurality of traces M1, a plurality of sub-block structures 152a, and a plurality of sub-block structures 152b. One of the sub-block structures 152a and one of the sub-block structures 152b are sequentially stacked on one of the traces M1 in a direction perpendicular to the carrying board 100, so as to form one of the sidewall block structures 150a. That is, the traces M1 may substantially serve as one of the sub-block structures constituting the sidewall block structures 150a.

According to the present embodiment, the traces M1 of at least one of the sidewall block structures 150a may be electrically connected to the electronic device 110. Namely, the sidewall block structures 150 may serve to transmit signals of the electronic device 110. According to another embodiment, none of the traces M1 of the sidewall block structures 150a are electrically connected to the electronic device 110. Thereby, the sidewall block structures 150a may be electrically floating or may serve to provide electrostatic discharge protection.

With reference to FIG. 3 and FIG. 4, the stacked sidewall block structures 150a are substantially shaped as a sheet and surround the electronic device 110 in the electronic device package 10c. That is, the sidewall block structures 150 allow the electronic device package 10c to be equipped with a plurality of stopper wall structures perpendicular to the planar surface of the carrying board 100, and the sidewall block structures 150 can block moisture from being diffused from the outer side of the electronic device package 10c to the central area AA and can prevent dysfunction of the electronic device 110. To be specific, the sidewall block structures 150a shaped as stopper walls enables the electronic device package 10c to have plural interfaces (from the inner side to the outer side) perpendicular to the planar surface of the carrying board 100. Similar to the interface 140 shown in FIG. 1, the interfaces provided in the present embodiment prevent the moisture from entering the inner side from the outer side through pin holes in the film layers. Besides, although three sidewall block structures 150a are depicted in FIG. 3, the number of the sidewall block structures 150a is not limited thereto. For instance, the electronic device package 10c may include one, two, or four sidewall block structures 150a. Particularly, in some embodiments of the invention, the sidewall block structures 150a are capable of blocking moisture, and thus the electronic device package with the sidewall block structures 150a may not require any barrier layer 130, or the barrier layer 130 may not be equipped with the sidewall contact portion 132 and the extending portion 134.

Figure 5:
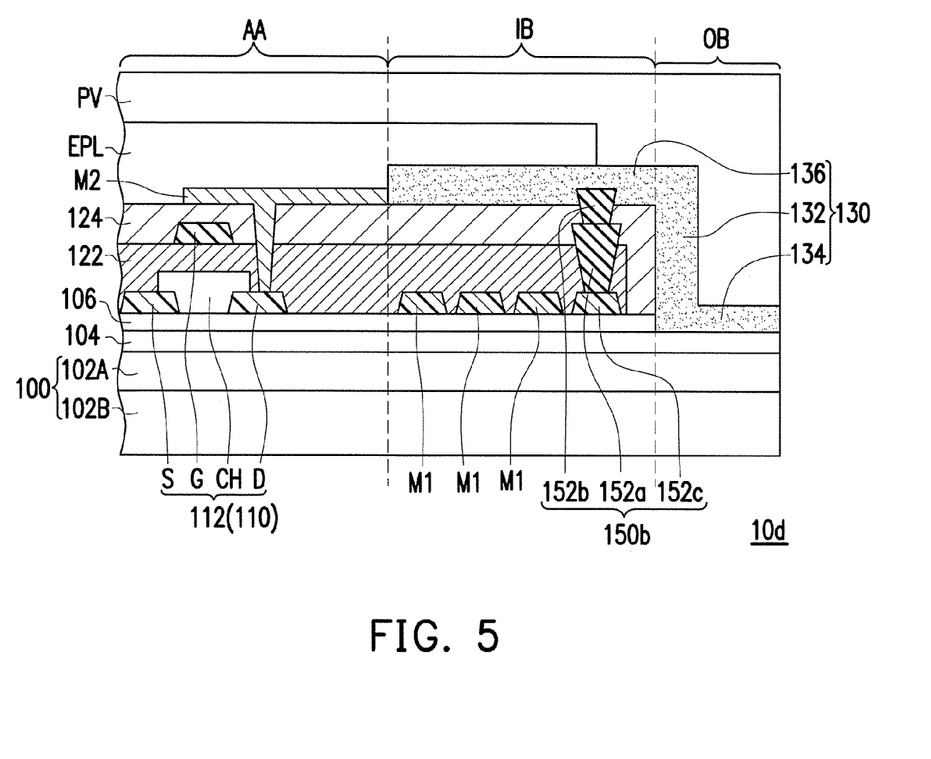
FIG. 5 is a schematic cross-sectional view of an electronic device package according to a fourth embodiment of the invention.

FIG. 5 is a schematic cross-sectional view of an electronic device package according to a fourth embodiment of the invention. Similar to the electronic device package 10c depicted in FIG. 4, the electronic device package 10d provided in the present embodiment and depicted in FIG. 5 includes the carrying board 100, the bottom barrier layer 104, the organic buffer layer 106, the electronic device 110, the first insulating layer 122, the second insulating layer 124, the barrier layer 130, the display medium layer EPL, the protection layer PV, the conductive layer M2, and the traces M1. The electronic device package 10d is similar to that depicted in FIG. 3, and the characteristics of the components and the connection correlations of the components in the electronic device package 10d may be referred to as those of the components in the electronic device package 10c and thus will not be further explained hereinafter.

According to the present embodiment of the invention, the electronic device package 10d further includes a sidewall block structure 150b located in the inner side area IB, and the sidewall block structure 150b penetrates the first insulating layer 122 and the second insulating layer 124 and constitutes a wall-like structure. The sidewall block structure 150b is located on the organic buffer layer 106 and covered by the cover portion 136 of the barrier layer 130. In the embodiment shown in FIG. 5, the sidewall block structure 150b includes sub-block structures 152a, 152b, and 152c. The sub-block structures 152a and 152b are sequentially stacked onto the sub-block structures 152c in a direction perpendicular to the carrying board 100. The sub-block structure 152a and the traces M1 may be in the same film layer.

Different from the embodiment shown in FIG. 3, the present embodiment discloses that the multi-layer sidewall block structure 150b and the single-layer traces M1 are independently disposed, such that the multi-layer sidewall block structure 150b is located on the outer side of the single-layer traces M1. Similar to the sidewall block structure 150a depicted in FIG. 3, the sidewall block structure 150b allows the electronic device package 10d to have a plurality of interfaces perpendicular to the planar surface of the carrying board 100, and thus the sidewall block structure 150b can block moisture from being diffused into the electronic device package 10d and can prevent dysfunction of the electronic device 110. Besides, in the present embodiment, the sidewall block structure 150*b* is similar to the sidewall block structure 150*a* and may be electrically connected to the electronic device 110, may be electrically floating, or may serve to provide electrostatic discharge protection. According to the present embodiment, the sidewall block structure 150*b* is located on the outer side of the traces M1; however, the invention is not limited thereto. For instance, the sidewall block structure 150*b* may also be arranged on another side close to the electronic device 110 (compared to the outer side of the traces M1. Particularly, in some embodiments of the invention, the sidewall block structure 150*b* is capable of blocking moisture, and thus the electronic device package with the sidewall block structure 150*b* may not require any barrier layer 130, or the barrier layer 130 may not be equipped with the sidewall contact portion 132 and the extending portion 134.

In the embodiment shown in FIG. 3 and FIG. 5, the electronic device package 10*c* and the electronic device package 10*d* are substantially constituted by plural film layers stacked on the carrying board 100. The source S, the drain D, the traces M1, and the sub-block structure 152*c* can together constitute a first conductive layer and can be simultaneously formed on the organic buffer layer 106. The organic semiconductor channel layer CH and the first insulating layer 122 are sequentially formed. At this time, the gate G and the sub-block structure 152*a* may together constitute a second conductive layer and may be simultaneously formed on the first insulating layer 122. The sub-block structure 152*a* penetrates the first insulating layer 122 and is in contact with the traces M1/the sub-block structure 152*c*. The second insulating layer 124 is then formed on the first insulating layer 122. The conductive layer M2 and the sub-block structure 152*b* may together constitute a third conductive layer and may be simultaneously formed on the second insulating layer 124. The sub-block structure 152*b* penetrates the second insulating layer 124 and is in contact with the sub-block structure 152*a*. That is, in the embodiments depicted in FIG. 3 and FIG. 5, the manufacturing process of the sidewall block structures 150*a* and 150*b* may be integrated to the existing manufacturing process. Since no additional manufacturing process is required, the costs are not increased.

In the present embodiment, the material of the first conductive layer, the second conductive layer, and the third conductive layer may be metal, metal alloy, conductive oxide, an organic conductive material, or a combination of the above, and each of the first, second, and third conductive layers may be constituted by multiple conductive material layers stacked together. In general, the WVTR of the metal material is less than that of the organic material. If the material of the sidewall block structures 150*a* and 150*b* includes metal, the sidewall block structures 150*a* and 150*b* can further prevent entry of the external moisture and enhance the package effect of protecting the electronic device 110 from moisture. Note that the above-listed materials are merely exemplary and should not be construed as limitations to the invention.

Figure 6:
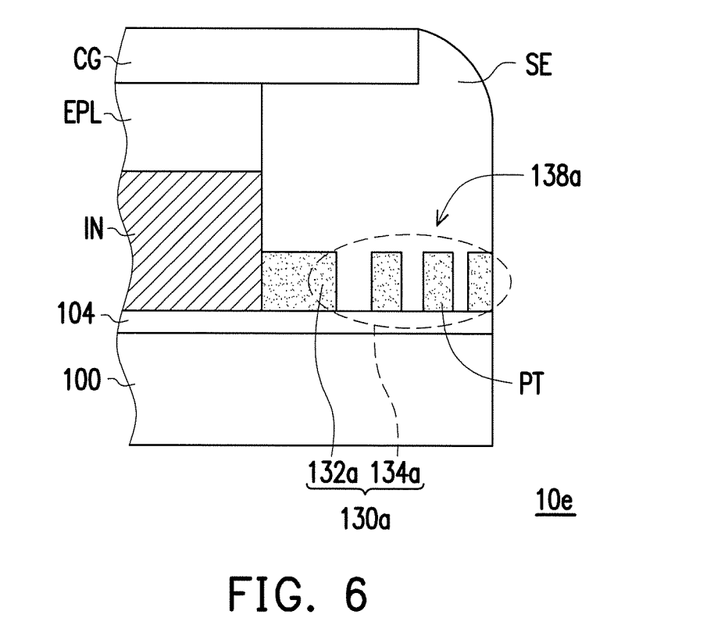
FIG. 6 is an enlarged view of some of components in an electronic device package according to a fifth embodiment of the invention.

FIG. 6 is an enlarged view of some of components in an electronic device package according to a fifth embodiment of the invention. Here, FIG. 6 merely illustrates the carrying board, the bottom barrier layer, the first insulating layer, the display medium layer, the protection layer, and the barrier layer of the electronic device package. With reference to FIG. 6, the electronic device package 10*e* includes the carrying board 100, the bottom barrier layer 104, the insulating layer IN, the display medium layer EPL, a barrier layer 130*a*, a package board CG, and a sealant SE. The barrier layer 130*a* includes a sidewall contact portion 132*a* and an extending portion 134*a*. The characteristics and the arrangement of the components in the electronic device package 10*e* may be referred to as those of the components in the electronic device package provided in any of the embodiments above and thus will not be further explained hereinafter The insulating layer IN may include the first insulating layer 122, the second insulating layer 124 provided in the previous embodiments, or a combination thereof. Besides, although FIG. 6 does not show the electronic device, the arrangement of the electronic device, the insulating layer IN, and the barrier layer 130*a* may be understood through the explanation provided above.

In the present embodiment, the difference between the barrier layer 130*a* and the barrier layer 130 is that the barrier layer 130*a* does not cover the insulating layer IN, and the extending portion 134*a* is constituted by a plurality of bumps PT, so as to form a concave-convex surface 138*a* on one side of the barrier layer 130*a* away from the carrying board 100. The bumps PT are separated from each other, and the concave-convex surface 138*a* has a sawtooth shape. In particular, after the barrier layer 130*a* is formed, the extending portion 134*a* of the barrier layer 130*a* may be patterned, such that the bumps PT are formed, and that the concave-convex surface 138*a* having the sawtooth shape is formed. The display medium layer EPL is packaged between the carrying board 100 and the package board CG. In an embodiment of the invention, the sealant SE may be applied to surround the display medium layer EPL, so as to assemble the carrying board 100 and the package board CG together. The interface formed between the concave-convex surface 138*a* and the sealant SE can effectively block moisture from being diffused into the first insulating layer 122 of the insulating layer IN from the outer side of the sealant SE and prevent the moisture from contacting the electronic device 110 (not shown in FIG. 6, see FIG. 1-FIG. 3 and FIG. 5). Moreover, the electronic device 110 (not shown in FIG. 6, see FIG. 1-FIG. 3 and FIG. 5) can function as usual.

Figure 7:
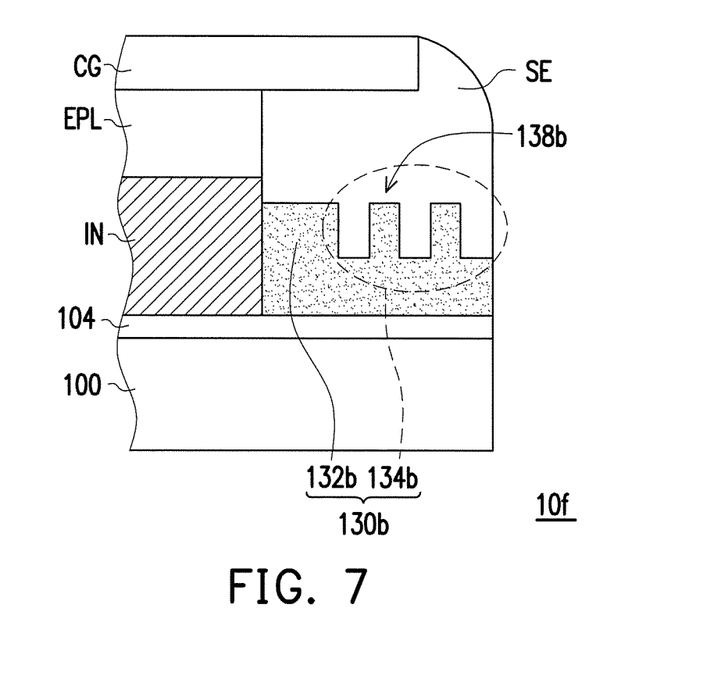
FIG. 7 is an enlarged view of some of components in an electronic device package according to a sixth embodiment of the invention.

FIG. 7 is an enlarged view of some of components in an electronic device package according to a sixth embodiment of the invention. Here, FIG. 7 merely illustrates the carrying board, the bottom barrier layer, the first insulating layer, the display medium layer, the protection layer, and the barrier layer of the electronic device package. With reference to FIG. 7, the electronic device package 10*f* includes the carrying board 100, the bottom barrier layer 104, the insulating layer IN, the display medium layer EPL, a barrier layer 130*b*, the package board CG, and the sealant SE. The barrier layer 130*b* includes a sidewall contact portion 132*b* and an extending portion 134*b*. The characteristics and the arrangement of the components in the electronic device package 10*f* may be referred to as those of the components in the electronic device package depicted in FIG. 6 and thus will not be further explained hereinafter. In the present embodiment, the electronic device package 10*f* is similar to the electronic device package 10*e* depicted in FIG. 6, i.e., the extending portion 134*b* of the barrier layer 130*b* has a concave-convex surface 138*b* at an upper side away from the carrying board 100. In the present embodiment, the extending portion 134*b* successively extends in an outward manner, and the concave-convex surface 138*b* has a microcup shape. Namely, the concave-convex surface 138*b* is constituted by a plurality of thick segments and a plurality of thin segments in the extending portion 134*b*, and the thick segments and the thin segments are alternately distributed. Besides, the display medium layer EPL is packaged between the carrying board 100 and the package board CG. In an embodiment of the invention, the sealant SE may be applied to surround the display medium layer EPL, so as to assemble the carrying board 100 and the package board CG together. The interface formed between the concave-convex surface 138b and the sealant SE can effectively block moisture from being diffused into the first insulating layer 122 of the insulating layer IN from the outer side of the sealant SE and prevent the moisture from contacting the electronic device 110 (not shown in FIG. 7, see FIG. 1-FIG. 3 and FIG. 5). Moreover, the electronic device 110 (not shown in FIG. 7, see FIG. 1-FIG. 3 and FIG. 5) can function as usual.

Figure 8:
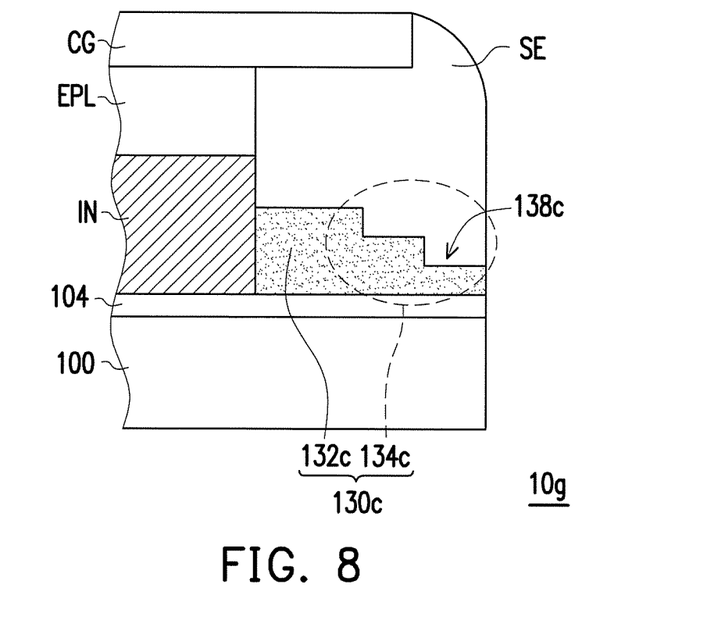
FIG. 8 is an enlarged view of some of components in an electronic device package according to a seventh embodiment of the invention.

FIG. 8 is an enlarged view of some of components in an electronic device package according to a seventh embodiment of the invention. Here, FIG. 8 merely illustrates the carrying board, the bottom barrier layer, the first insulating layer, the display medium layer, the protection layer, and the barrier layer of the electronic device package. With reference to FIG. 8, the electronic device package 10g includes the carrying board 100, the bottom barrier layer 104, the insulating layer IN, the display medium layer EPL, a barrier layer 130c, the package board CG, and the sealant SE. The barrier layer 130c includes a sidewall contact portion 132c and an extending portion 134c. The display medium layer EPL is packaged between the carrying board 100 and the package board CG. The sealant SE surrounds the display medium layer EPL, so as to assemble the carrying board 100 and the package board CG together. The characteristics and the arrangement of the components in the electronic device package 10g may be referred to as those of the components in the electronic device packages provided in the previous embodiments and thus will not be further explained hereinafter In the present embodiment, the electronic device package 10g is similar to the electronic device package 10e depicted in FIG. 6, i.e., the extending portion 134c of the barrier layer 130c has a concave-convex surface 138c at an upper side away from the carrying board 100. The way to form the concave-convex surface 138c can be derived from the descriptions in connection with FIG. 6 and thus will not be further explained hereinafter. Different from the concave-convex surface 138a of the electronic device package 10e, the concave-convex surface 138c of the electronic device package 10g has a ladder shape. The concave-convex surface 138c can effectively block moisture from being diffused into the first insulating layer 122 of the insulating layer IN from the outer side of the sealant SE and prevent the moisture from contacting the electronic device 110. Moreover, the electronic device 110 can function as usual.

It should be mentioned that the concave-convex surfaces 138a, 138b, and 138c of the extending portions 134a, 134b, and 134c depicted in FIG. 6, FIG. 7, and FIG. 8 can be applied to the electronic device packages shown in FIG. 1, FIG. 2, FIG. 3, and FIG. 5, so as to better protect the electronic devices in the electronic device packages from moisture. Besides, the actual shape of the concave-convex surface is not limited herein. The shape of each of the aforesaid concave-convex surfaces 138a, 138b, and 138c is merely exemplary and should not be construed as a limitation to the invention. For instance, the aforesaid concave-convex surfaces may have a sawtooth shape, a micro-cup shape, a ladder shape, a heart shape, a triangular shape, or a combination of any of the above shapes.

Figure 9:
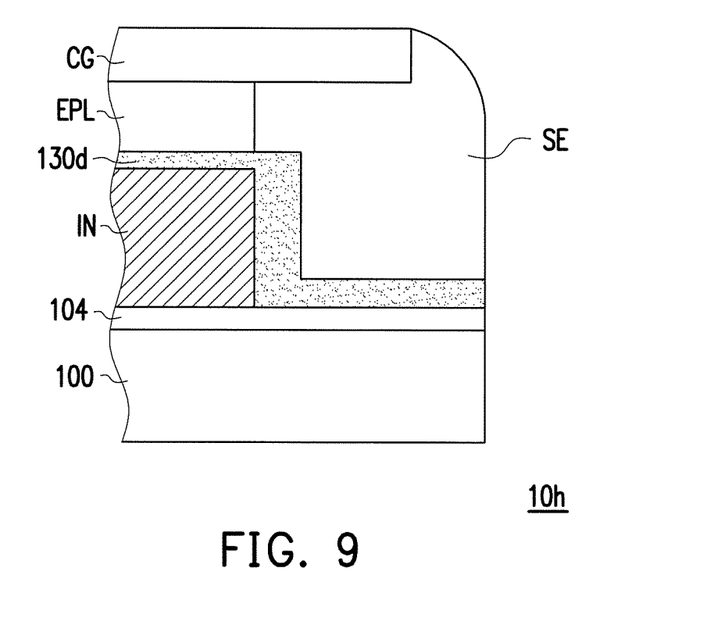
FIG. 9 is an enlarged view of some of components in an electronic device package according to an eighth embodiment of the invention.

FIG. 9 is an enlarged view of some of components in an electronic device package according to an eighth embodiment of the invention. With reference to FIG. 9, the electronic device package 10h includes the carrying board 100, the bottom barrier layer 104, the insulating layer IN, the display medium layer EPL, and a barrier layer 130d. The characteristics and the arrangement of the carrying board 100, the bottom barrier layer 104, the insulating layer IN, the display medium layer EPL in the electronic device package 10h may be referred to as those of the components in the electronic device packages provided in the previous embodiments and thus will not be further explained hereinafter The barrier layer 130d may be implemented in the same manner of implementing the barrier layer 130 provided in the previous embodiments. The electronic device package 10h may further include the electronic device 110 and/or the sidewall block structure 150a or 150b provided in the previous embodiment, which should however not be construed as a limitation to the invention. Particularly, in the present embodiment, the display medium layer EPL is packaged between the carrying board 100 and the package board CG, and the sealant SE surrounds the display medium layer EL and is configured to assemble the carrying board 100 and the package board CG. The way to arrange the package board CG and the sealant SE may be applied to replace the protection layer PV provided in any of the previous embodiments. That is, the display medium layer EPL may or may not be packaged with use of the protection layer PV shaped as a thin film; instead, the display medium layer EPL may be packaged with use of the package board CG and the sealant SE.

To sum up, due to the barrier layer and the sidewall block structures in the electronic device package provided herein, the number of interfaces perpendicular to the planar surface of the carrying board in the electronic device package can be increased. Here, the interfaces are located around the electronic device package and surround the electronic device, so as to effectively block moisture from being diffused into the inner side from the outer side. Thereby, the electronic device in the electronic device package can be better protected from moisture permeating through the sides of the electronic device package. Besides, the manufacturing process of the sidewall block structures can be integrated into the existing manufacturing process and thus does not increase the total costs.

Although the disclosure has been provided with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. An electronic device package comprising:
   a carrying board comprising a central area, an inner edge area, and an outer edge area, the inner edge area being located between the central area and the outer edge area;
   an electronic device located in the central area of the carrying board;
   a first insulating layer located on the carrying board and overlapped with the electronic device, the first insulating layer extending from the central area to the inner edge area;
   a barrier layer located on the carrying board, the barrier layer comprising a sidewall contact portion and an extending portion, the sidewall contact portion surrounding a side surface of the first insulating layer, the extending portion extending from the sidewall contact portion to the outer edge area in a direction away from the first insulating layer; and
   a sidewall block structure located in the inner edge area, the sidewall block structure penetrating the first insulating layer and constituting a wall-like structure, wherein a top of the sidewall block structure is covered by the barrier layer and a portion of the first insulating layer is located between the sidewall block structure and the sidewall contact portion of the barrier layer.

2. The electronic device package of claim 1, wherein the barrier layer further comprises a cover portion, the cover portion extends from the sidewall contact portion in a direction away from the extending portion and covers the first insulating layer, and the cover portion exposes the central portion.

3. The electronic device package of claim 1, wherein the electronic device comprises a gate, a source, a drain, and an organic semiconductor channel layer, an area of the gate is overlapped with an area of the organic semiconductor channel layer, the first insulating layer is located between the gate and the organic semiconductor channel layer, and the source and the drain are connected to the organic semiconductor channel layer.

4. The electronic device package of claim 1, wherein the sidewall contact portion covers the side surface of the first insulating layer.

5. The electronic device package of claim 1, further comprising a second insulating layer, the first insulating layer being located between the second insulating layer and the carrying board.

6. The electronic device package of claim 5, wherein an area of the second insulating layer exceeds the first insulating layer and has a sidewall portion, and the sidewall portion is located between the side surface of the first insulating layer and the sidewall contact portion.

7. The electronic device package of claim 1, wherein the sidewall block structure comprises a plurality of sub-block structures stacked together in a direction perpendicular to the carrying board.

8. The electronic device package of claim 7, wherein a material of each of the sub-block structures comprises metal.

9. The electronic device package of claim 1, wherein the extending portion of the barrier layer has a concave-convex surface at an upper side away from the carrying board.

10. The electronic device package of claim 9, wherein the concave-convex surface has a sawtooth shape, a micro-cup shape, a ladder shape, or a combination of any of the above shapes.

11. The electronic device package of claim 1, wherein a material of the barrier layer is SiNx, SiOx, or multiple layers of SiNx/SiOx thin films.

12. The electronic device package of claim 1, further comprising:
an organic buffer layer located between the electronic device and the carrying board;
a bottom barrier layer located between the organic buffer layer and the carrying board;
a display medium layer located on the electronic device, wherein the display medium layer and the electronic device are electrically connected to each other and configured to display images; and
a protection layer located on the display medium layer.

13. The electronic device package of claim 12, wherein the extending portion of the barrier layer is in contact with the bottom barrier layer.

14. The electronic device package of claim 12, wherein the sidewall contact portion of the barrier layer covers a side surface of the organic buffer layer.

15. An electronic device package comprising:
a carrying board comprising a central area and an edge area;
an electronic device located in the central area of the carrying board, wherein the electronic device comprises a gate, a source, a drain, and an organic semiconductor channel layer connecting to the source and the drain;
a plurality of insulating layers located on the carrying board and overlapped with the electronic device, the insulating layers respectively extending from the central area to the edge area, wherein one of the insulating layers separates the gate from the organic semiconductor channel layer; and
a sidewall block structure located in the edge area, the sidewall block structure penetrating the insulating layers and constituting a stopper wall, wherein the sidewall block structure comprises a plurality of sub-block structures stacked together in a direction perpendicular to the carrying board, and
wherein at least two layers of the sub-block structures are made by metal, and one of the sub-block structures and one of the gate, the source and the drain are formed by the same layer.

16. The electronic device package of claim 15, wherein one of the sub-block structures is electrically connected to the electronic device.

17. The electronic device package of claim 15, wherein a material of each of the sub-block structures comprises metal.

18. The electronic device package of claim 17, wherein the sidewall block structure is electrically floating.

19. The electronic device package of claim 15, wherein the insulating layers comprise a first insulating layer and a second insulating layer, an area of the gate is overlapped with an area of the organic semiconductor channel layer, the first insulating layer is located between the gate and the organic semiconductor channel layer, and the first insulating layer is located between the second insulating layer and the carrying board.

20. The electronic device package of claim 15, further comprising:
an organic buffer layer located between the electronic device and the carrying board;
a bottom barrier layer located between the organic buffer layer and the carrying board;
a display medium layer located on the electronic device, wherein the display medium layer and the electronic device are electrically connected to each other and configured to display images; and
a protection layer located on the display medium layer.

* * * * *